United States Patent
Akahane

(10) Patent No.: US 12,218,656 B2
(45) Date of Patent: Feb. 4, 2025

(54) DRIVING APPARATUS AND DRIVING METHOD

(71) Applicant: FUJI ELECTRIC CO., LTD., Kawasaki (JP)

(72) Inventor: Masashi Akahane, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 18/172,254

(22) Filed: Feb. 21, 2023

(65) Prior Publication Data

US 2023/0327659 A1 Oct. 12, 2023

(30) Foreign Application Priority Data

Apr. 11, 2022 (JP) .................... 2022-064949

(51) Int. Cl.
| | |
|---|---|
| H03K 17/14 | (2006.01) |
| H03F 3/45 | (2006.01) |
| H03K 17/08 | (2006.01) |
| H03K 17/081 | (2006.01) |
| H03K 17/567 | (2006.01) |

(52) U.S. Cl.
CPC ....... *H03K 17/145* (2013.01); *H03F 3/45273* (2013.01); *H03K 17/08104* (2013.01); *H03K 17/567* (2013.01); *H03K 2017/0806* (2013.01)

(58) Field of Classification Search
CPC .......... H03K 17/145; H03K 17/08104; H03K 17/567; H03K 2017/0806; H03F 3/45273
See application file for complete search history.

(56) References Cited

U.S. PATENT DOCUMENTS

| | | | |
|---|---|---|---|
| 8,970,259 B2 * | 3/2015 | Mori ................... | H03K 17/145 |
| | | | 327/108 |
| 2019/0190369 A1* | 6/2019 | Nakamori ............ | H03K 17/567 |
| 2021/0288571 A1* | 9/2021 | Nakamori ............ | H03K 17/165 |

FOREIGN PATENT DOCUMENTS

| | | |
|---|---|---|
| JP | 2003274672 A | 9/2003 |
| JP | 2008182835 A | 8/2008 |
| JP | 2019110677 A | 7/2019 |

* cited by examiner

*Primary Examiner* — Ryan Johnson
*Assistant Examiner* — Colleen J O Toole

(57) ABSTRACT

Provided is a driving apparatus including a temperature detection circuit configured to output a temperature detection signal corresponding to a temperature of a switching device, a current detection circuit configured to sample, at a timing during an ON period of the switching device, a current detection signal corresponding to a current that flows in the switching device, and a driving circuit configured to adjust, according to the temperature detection signal and the current detection signal, a driving current to be supplied to a control terminal of the switching device. When the current detection signals are the same, the driving circuit may decrease the driving current according to the temperature detection signal indicating a lower temperature of the switching device. When the temperature detection signals are the same, the driving circuit may decrease the driving current according to the current detection signal indicating a smaller current regarding the main current.

13 Claims, 19 Drawing Sheets

| TEMPERATURE | INPUT | | OUTPUT | | |
|---|---|---|---|---|---|
| | OTMEN | OTHEN | TL | TM | TH |
| <T1 | 0 | 0 | 1 | 0 | 0 |
| <T2 | 1 | 0 | 0 | 1 | 0 |
| ≧T2 | 1 | 1 | 0 | 0 | 1 |

FIG.4

| | INPUT | | | | | OUTPUT |
|---|---|---|---|---|---|---|
| TEMPERATURE | CURRENT | TL | TM | TH | ILOW | IDREF |
| ≧T2 | | 0 | 0 | 1 | | V1 |
| <T2 | | 0 | 1 | 0 | | V2 |
| <T1 | ≧I1 | 1 | 0 | 0 | 0 | V3 |
| <T1 | <I1 | 1 | 0 | 0 | 1 | V4 |

FIG.7

| | INPUT | | | | | OUTPUT |
|---|---|---|---|---|---|---|
| TEMPERATURE | CURRENT | TL | TM | TH | ILOW | IDREF |
| ≧T2 | ≧I1 | 0 | 0 | 1 | 0 | V1 |
| | <I1 | 0 | 0 | 1 | 1 | V2 |
| <T2 | ≧I1 | 0 | 1 | 0 | 0 | V3 |
| | <I1 | 0 | 1 | 0 | 1 | V4 |
| <T1 | ≧I1 | 1 | 0 | 0 | 0 | V5 |
| | <I1 | 1 | 0 | 0 | 1 | V6 |

FIG.14

| INPUT | | | | | | CONTROL SIGNAL | | | |
|---|---|---|---|---|---|---|---|---|---|
| TEMPERATURE | CURRENT | TL | TM | TH | ILOW | D3 | D2 | D1 | D0 |
| ≧T2 | | 0 | 0 | 1 | | 1 | 1 | 1 | 1 |
| <T2 | | 0 | 1 | 0 | | 0 | 1 | 1 | 1 |
| <T1 | ≧I1 | 1 | 0 | 0 | 0 | 0 | 0 | 1 | 1 |
| <T1 | <I1 | 1 | 0 | 0 | 1 | 0 | 0 | 0 | 1 |

*FIG.18*

DRIVING APPARATUS AND DRIVING METHOD

The contents of the following Japanese patent application(s) are incorporated herein by reference:
NO. 2022-064949 filed in JP on Apr. 11, 2022

BACKGROUND

1. Technical Field

The present invention relates to a driving apparatus and a driving method.

2. Related Art

Patent Document 1 describes that "a detection of an operation temperature of a power semiconductor switching device is performed at a timing corresponding to a control signal from an external control circuit instead of performing it constantly. By detecting the operation temperature at a predetermined timing, for example, a timing of turning off the power semiconductor switching device, an effect of switching noises of the power semiconductor switching device is reduced as compared to the case where the operation temperature is detected constantly. Accordingly, the effect of switching noises of the power semiconductor switching device is reduced, and a magnitude of a current for driving the power semiconductor switching device becomes changeable" (paragraph 0009).

Patent Document 2 describes that "in short, the semiconductor device according to this invention updates, according to a temperature, a threshold for switching a switching speed of an output transistor which drives a load from a low speed to a high speed. In a high-temperature state, that threshold is set to be low." (paragraph 0023), and that "the semiconductor device according to this invention includes a temperature sensor which detects an operation temperature of a switching device that drives an output load, and a gate control circuit which changes the threshold for switching the switching speed of the switching device according to a detection output of this temperature sensor. This gate control circuit lowers the threshold when the detection output of the temperature sensor indicates an increase of the temperature" (paragraph 0024).

Patent Document 3 describes that "this invention according to claim 1 increases a gate resistance value to reduce generation of noises when a load current becomes equal to or smaller than a predetermined value, and decreases the gate resistance when the load current exceeds a predetermined value and also when the device temperature exceeds a predetermined temperature, to thereby reduce a switching loss and prevent a thermal destruction" (paragraph 0018).

PRIOR ART DOCUMENTS

Patent Documents

Patent Document 1: Japanese Patent Application Publication No. 2019-110677
Patent Document 2: Japanese Patent Application Publication No. 2008-182835
Patent Document 3: Japanese Patent Application Publication No. 2003-274672

BRIEF DESCRIPTION OF THE DRAWINGS

FIG. 4 shows an input/output of the temperature detection circuit 130 according to the present embodiment.

FIG. 7 shows an input/output of a voltage output circuit 160 according to the present embodiment.

FIG. 14 shows an input/output of the voltage output circuit 1300 according to the first modified example of the present embodiment.

FIG. 18 shows an input/output of a decoder circuit 1710 according to the third modified example of the present embodiment.

DESCRIPTION OF EXEMPLARY EMBODIMENTS

Hereinafter, an embodiment of the present invention will be described. The embodiment does not limit the invention according to the claims. In addition, not all combinations of features described in the embodiment are essential to the solution of the invention.

Figure 1:
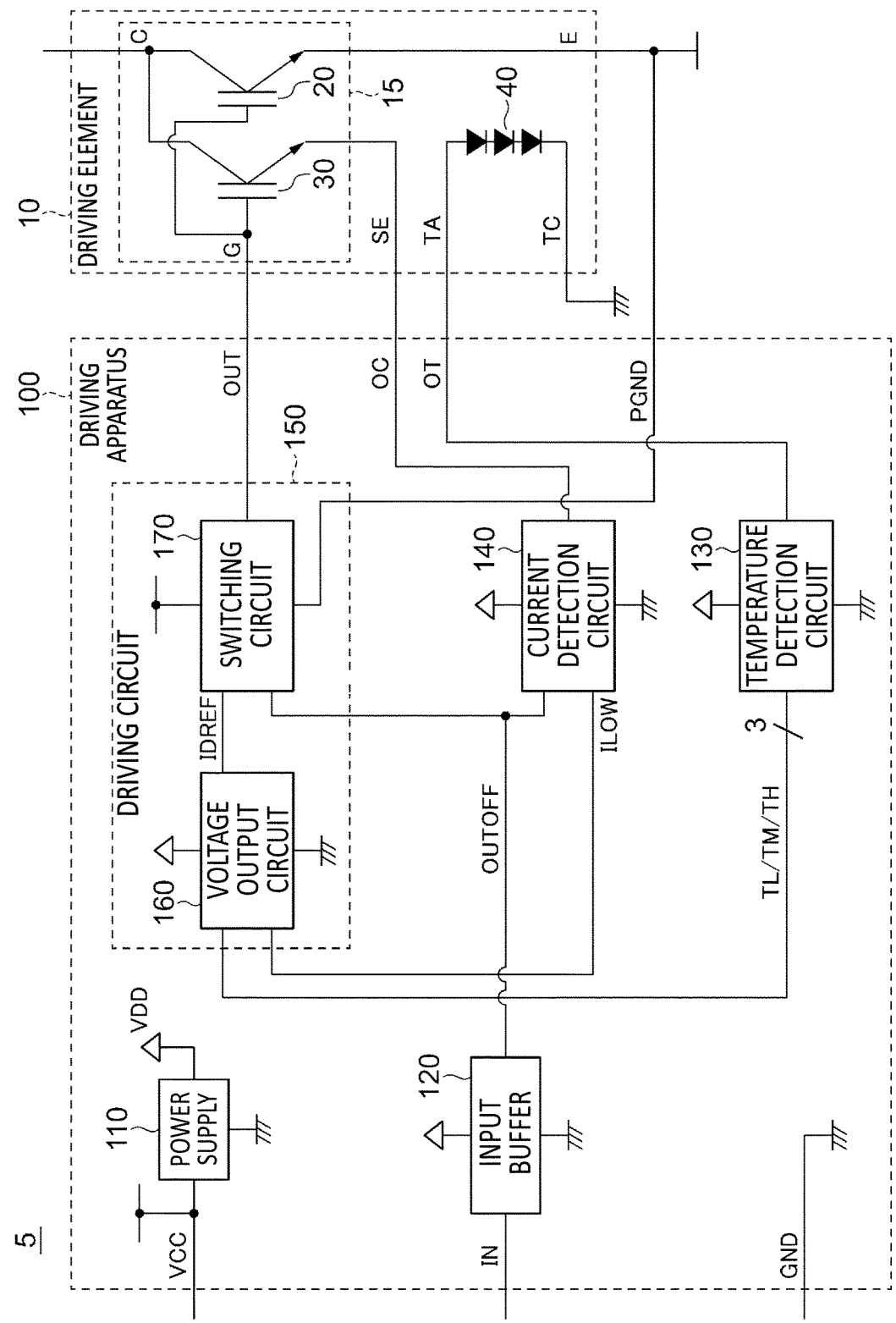
FIG. 1 shows a configuration of an apparatus 5 according to the present embodiment.

FIG. 1 shows a configuration of an apparatus 5 according to the present embodiment. The apparatus 5 includes a driving element 10 and a driving apparatus 100.

The apparatus 5 includes a switching device 15 and a temperature sensor 40. The switching device 15 is a semiconductor switching device such as an IGBT (Insulated Gate Bipolar Transistor) or a MOSFET (Metal-Oxide Semiconductor Field-Effect Transistor). The switching device 15 may be a SiC-IGBT or a SiC-MOSFET that are capable of switching at a higher speed. The switching device 15 includes a first main terminal, a second main terminal, and a control terminal which controls a connected state between the first main terminal and the second main terminal. The switching device 15 includes a collector ("C" in the figure) and an emitter ("E" in the figure) as the first main terminal and the second main terminal, and includes a gate ("G" in the figure) as the control terminal. When the switching device 15 is a MOSFET, the switching device 15 includes a drain and a source as the first main terminal and the second main terminal, and includes a gate as the control terminal. In the present embodiment, for convenience of descriptions, the switching device 15 that is an IGBT is shown.

The switching device 15 includes a main switching device 20 as a main cell that causes a main current to flow and a sense switching device 30 as a current sense cell that causes a sense current to flow, and has a configuration in which the main cell is connected between the collector and the emitter, the current sense cell is connected between the collector and a sense emitter and the gate of the switching device 15 is connected to the gates of both the main cell and the current sense cell. The current sense cell is set to have an area ratio smaller than 1/1000 that of the main cell, or the like, and causes a sense current of a ratio corresponding to the area ratio (for example, 1/1000) to flow with respect to the main current in a steady state.

The temperature sensor 40 is arranged near the switching device 15 and detects a temperature of the switching device 15. In the present embodiment, a thermal diode is used as an example of the temperature sensor 40. Alternatively, the temperature sensor 40 may be another type of temperature sensor.

The driving apparatus 100 includes a power supply 110, an input buffer 120, a temperature detection circuit 130, a current detection circuit 140, and a driving circuit 150. The power supply 110 is, for example, a voltage regulator. The power supply 110 converts a power supply voltage VCC input from outside into a power supply voltage VDD to be used inside the driving apparatus 100.

The input buffer 120 amplifies a control signal IN input from outside, and outputs it as a control signal OUTOFF. The control signal OUTOFF is a signal that instructs the switching device 15 to be in a disconnected state in a case of a logic H (high), and the switching device 15 to be in a connected state in a case of a logic L (low).

The temperature detection circuit 130 is connected to the temperature sensor 40 inside the driving element 10. The temperature detection circuit 130 is input with a detection value OT of the temperature sensor 40, and outputs a temperature detection signal corresponding to the temperature of the switching device 15 (for example, TL/TM/TH in the figure).

The current detection circuit 140 is connected to a sense terminal SE of the switching device 15 (the emitter terminal of the sense switching device 30) and to the input buffer 120. The current detection circuit 140 is input with a detection value OC corresponding to a current that flows in the sense terminal SE of the switching device 15, and outputs a current detection signal corresponding to the current that flows in the switching device 15 (for example, ILOW in the figure). The current detection circuit 140 according to the present embodiment samples, at a timing during an ON period of the switching device 15, the current detection signal corresponding to the current that flows in the switching device 15, and outputs a result of the sampling at a timing of ending the ON period of the switching device 15.

The driving circuit 150 is connected to the input buffer 120, the temperature detection circuit 130, and the current detection circuit 140. The driving circuit 150 drives the control terminal G (gate) of the switching device 15 in response to the control signal OUTOFF, to thus switch on/off of the switching device 15. Herein, the driving circuit 150 can change the switching speed of the switching device 15 by adjusting, according to the temperature detection signal and the current detection signal, a driving current to be supplied to the control terminal G of the switching device 15.

The driving circuit 150 includes a voltage output circuit 160 and a switching circuit 170. The voltage output circuit 160 is connected to the temperature detection circuit 130 and the current detection circuit 140. The voltage output circuit 160 outputs a control voltage IDREF corresponding to the temperature detection signal TL/TM/TH from the temperature detection circuit 130 and the current detection signal ILOW from the current detection circuit 140.

The switching circuit 170 is connected to the input buffer 120 and the voltage output circuit 160. The switching circuit 170 outputs a driving signal OUT corresponding to the control signal OUTOFF from the input buffer 120 to the switching device 15, to thus drive the control terminal G of the switching device 15. The switching circuit 170 adjusts, according to the control voltage IDREF, the driving current to be supplied to the control terminal G when driving the control terminal G.

Figure 2:
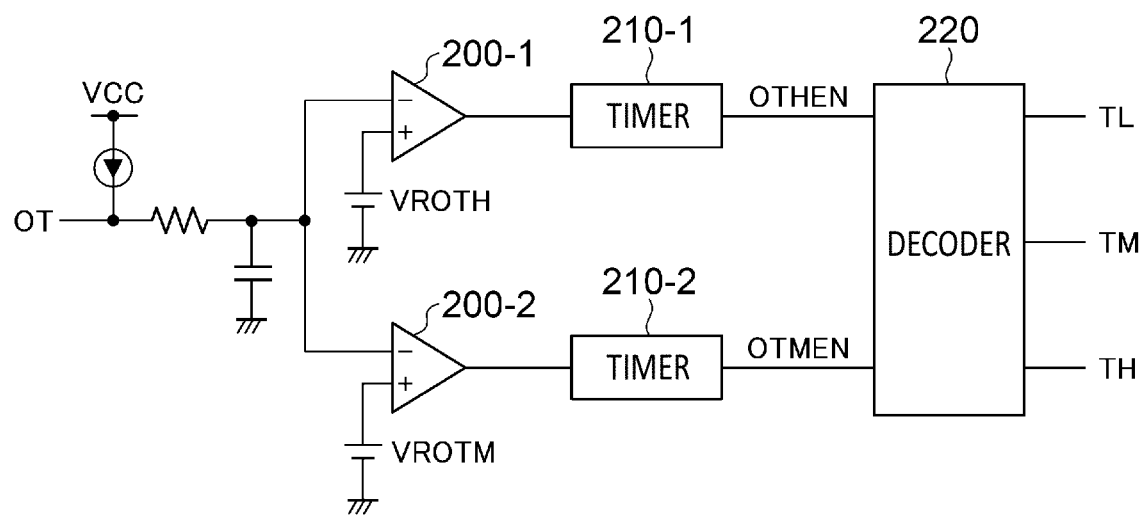
FIG. 2 shows a configuration of a temperature detection circuit 130 according to the present embodiment.

FIG. 2 shows a configuration of the temperature detection circuit 130 according to the present embodiment. The temperature detection circuit 130 includes one or more comparators 200-1 and 200-2 (also referred to as "comparators 200"), one or more timers 210-1 and 210-2 (also referred to as "timers 210"), a decoder 220, and other circuit elements. A constant current source connected between the power supply voltage VCC and the temperature sensor 40 ("detection value OT" in the figure) causes a constant current to flow in the temperature sensor 40. Accordingly, the temperature sensor 40 generates a voltage corresponding to the temperature of the switching device 15 as the detection value OT. A smoothing filter of an RC integration circuit or the like smoothens the detection value OT.

One or more comparators 200 classify the detection values OT into a plurality of voltage ranges. In the example shown in the present figure, the comparators 200-1 and 200-2 classify the detection values OT into a range equal to or smaller than a voltage threshold VROTH (temperature≥T2), a range which exceeds the voltage threshold VROTH and is equal to or smaller than a voltage threshold VROTM (T1≤temperature<T2), and a range exceeding the voltage threshold VROTM (temperature<T1), and outputs signals OTHEN and OTMEN indicating the classification result. The decoder 220 decodes the signals OTHEN and OTMEN and outputs the signals as temperature detection signals TL/TM/TH obtained by classifying the temperature of the switching device 15 into the plurality of temperature ranges.

Figure 3:
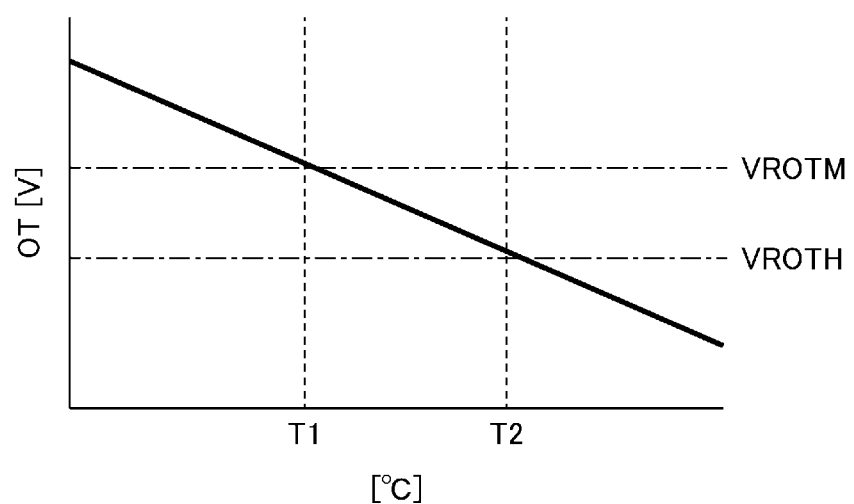
FIG. 3 shows a relationship between an input to the temperature detection circuit 130 according to the present embodiment and a temperature.

FIG. 3 shows a relationship between an input to the temperature detection circuit 130 according to the present embodiment and the temperature. In the present embodiment, the temperature sensor 40 is realized by a thermal diode. Since a voltage drop becomes smaller as the temperature increases in the thermal diode, the temperature sensor 40 outputs a detection value OT of a lower voltage as the temperature of the switching device 15 increases. The voltage threshold VROTM shown in FIG. 2 is set to a voltage of the detection value OT when the temperature of the switching device 15 becomes a temperature threshold T1. The voltage threshold VROTH shown in FIG. 2 is set to a voltage of the detection value OT when the temperature of the switching device 15 becomes a temperature threshold T2 (T2>T1).

FIG. 4 shows an input/output of the temperature detection circuit 130 according to the present embodiment. The comparator 200-1 outputs the signal OTHEN that becomes a logic 1 when the detection value OT is equal to or smaller than the voltage threshold VROTH (temperature≥T2) and becomes a logic 0 when the detection value OT exceeds the voltage threshold VROTH (temperature<T2). The comparator 200-2 outputs the signal OTMEN that becomes the logic 1 when the detection value OT is equal to or smaller than the voltage threshold VROTM (temperature≥T1) and becomes the logic 0 when the detection value OT exceeds the voltage threshold VROTM (temperature<T1). The decoder 220 decodes such signals OTHEN and OTMEN and sets the temperature detection signal TL to be the logic 1 in the case of temperature<T1, the temperature detection signal TM to be the logic 1 in the case of T1≤temperature<T2, and the temperature detection signal TH to be the logic 1 in the case of T2≤temperature.

Figure 5:
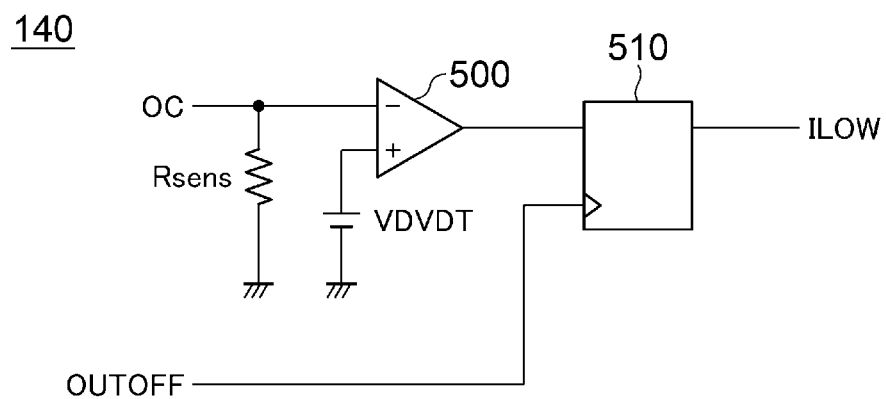
FIG. 5 shows a configuration of a current detection circuit 140 according to the present embodiment.

FIG. 5 shows a configuration of the current detection circuit 140 according to the present embodiment. The current detection circuit 140 includes a sense resistor Rsens, a comparator 500, and a flip-flop 510. The sense resistor Rsens is connected between the sense terminal of the switching device 15 and a reference potential (a ground potential in the example shown in the present figure), and causes a sense current proportional to the current that flows in the switching device 15 to flow. Accordingly, the detection value OC becomes a voltage value corresponding to the current that flows in the switching device 15.

The comparator 500 compares the detection value OC and a threshold voltage VDVDT. The comparator 500 outputs the logic 1 to ILOW when the detection value OC is smaller than the threshold voltage VDVDT (current that flows in switching device 15<I1), and outputs the logic 0 when the detection value OC is equal to or larger than the threshold voltage VDVDT (current that flows in switching device 15≥I1). The signal output by the comparator 500 is an example of the current detection signal corresponding to the current that flows in the switching device 15.

The flip-flop 510 samples, at a timing during an ON period of the switching device 15, the current detection signal corresponding to the current that flows in the switching device 15. In the present figure, the flip-flop 510 latches the current detection signal at a timing of a rise of the control signal OUTOFF. Accordingly, the flip-flop 510 can sample the current detection signal corresponding to the current that flows in the switching device 15 at an end timing of the steady state where the switching device 15 is ON. The flip-flop 510 outputs the sampled current detection signal as ILOW.

Figure 6:
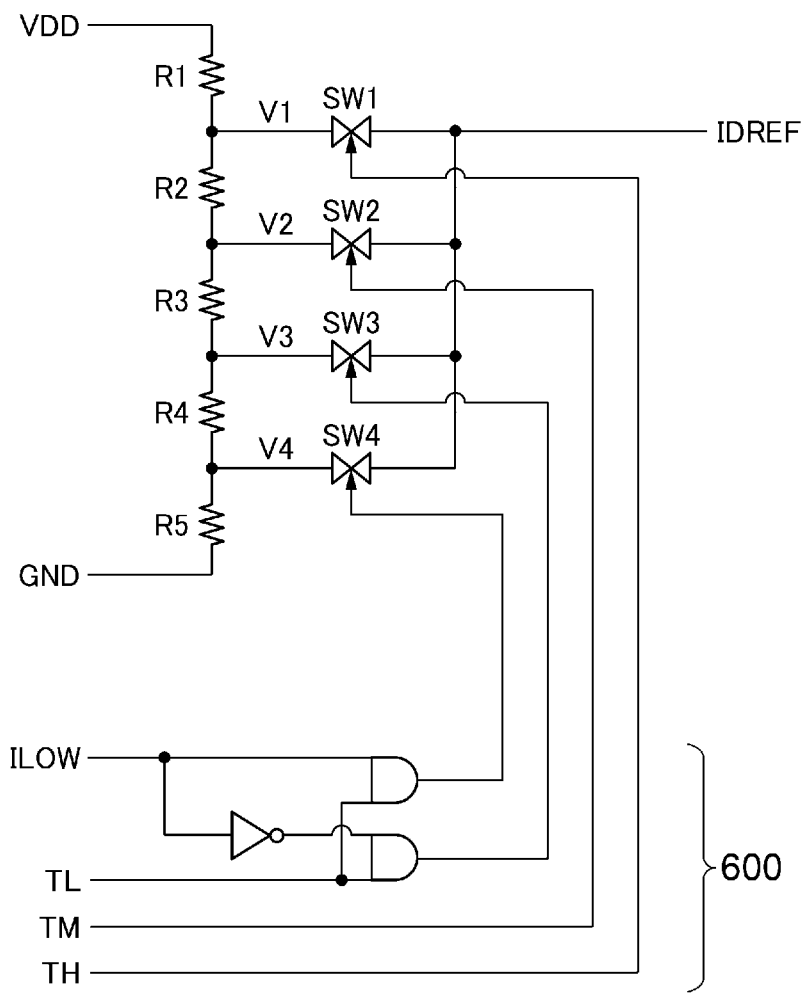
FIG. 6 shows a configuration of a voltage output circuit 160 according to the present embodiment.

FIG. 6 shows a configuration of the voltage output circuit 160 according to the present embodiment. The voltage output circuit 160 includes a variable resistor circuit constituted of a plurality of resistors R1 to R5 and a plurality of switches SW1 to SW4, and a decoder circuit 600. The plurality of resistor R1 to R5 are connected in series between the power supply voltage VDD and the reference potential (the ground potential in the example shown in the present figure), and divide the power supply voltage VDD. The plurality of switches SW1 to SW4 are respectively connected between the respective resistors, that is, the plurality of resistors R1 to R5, and the output of the voltage output circuit 160. The decoder circuit 600 decodes the temperature detection signal TL/TM/TH and the current detection signal ILOW, and outputs a signal for turning on/off each of the switches SW1 to SW4.

FIG. 7 shows an input/output of the voltage output circuit 160 according to the present embodiment. The decoder circuit 600 turns on the switch SW1 shown in FIG. 6 in the case of temperature detection signal TH=1 (logic 1) (in the case of temperature T2). At this time, the decoder circuit 600 turns off the switches SW2 to SW4. Accordingly, the voltage output circuit 160 outputs a voltage V1 between the resistors R1 and R2 as the control voltage IDREF.

The decoder circuit 600 turns on the switch SW2 shown in FIG. 6 in the case of temperature detection signal TM=1 (in the case of T1 temperature<T2). At this time, the decoder circuit 600 turns off the switches SW1, SW3, and SW4. Accordingly, the voltage output circuit 160 outputs a voltage V2 (<V1) between the resistors R2 and R3 as the control voltage IDREF.

The decoder circuit 600 turns on the switch SW3 shown in FIG. 6 in the case of temperature detection signal TL=1 and also current detection signal ILOW=0 (in the case of temperature<T1 and also current indicated by current detection signal ILOW≥I1). At this time, the decoder circuit 600 turns off the switches SW1, SW2, and SW4. Accordingly, the voltage output circuit 160 outputs a voltage V3 (<V2) between the resistors R3 and R4 as the control voltage IDREF.

The decoder circuit 600 turns on the switch SW4 shown in FIG. 6 in the case of temperature detection signal TL=1 and also current detection signal ILOW=1 (in the case of temperature<T1 and also current indicated by current detection signal ILOW<I1). At this time, the decoder circuit 600 turns off the switches SW1 to SW3. Accordingly, the voltage output circuit 160 outputs a voltage V4 (<V3) between the resistors R4 and R5 as the control voltage IDREF.

Figure 8:
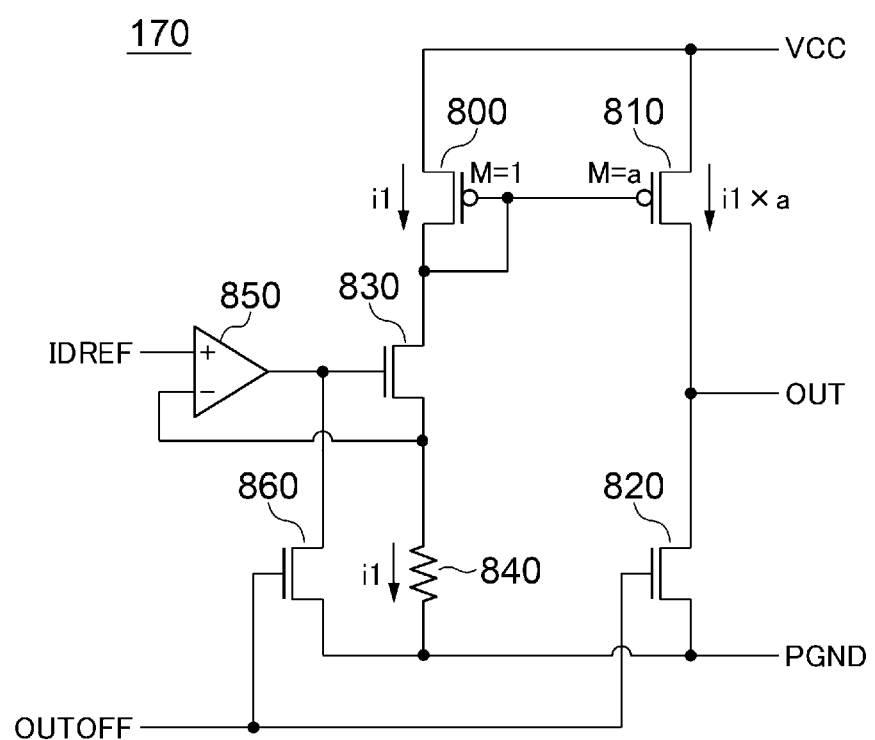
FIG. 8 shows a configuration of a switching circuit 170 according to the present embodiment.

FIG. 8 shows a configuration of the switching circuit 170 according to the present embodiment. The switching circuit 170 includes a MOSFET 800, a MOSFET 810, a MOSFET 820, a MOSFET 830, a resistor 840, a differential amplifier circuit 850, and a MOSFET 860. The MOSFET 800 and the MOSFET 810 function as a current mirror circuit that outputs a driving current i1×a obtained by amplifying a current i1 (an inter-DS current of the MOSFET 800) supplied to the MOSFET 800 by a times, to the control terminal G of the switching device 15. A source of the MOSFET 800 is connected to the power supply voltage VCC so that a connection is made between the gate and the drain. In the MOSFET 810, a source is connected to the power supply voltage VCC, a gate is connected to the gate of the MOSFET 800, and a drain is connected to the control terminal G of the switching device 15 as the output of the switching circuit 170.

The MOSFET 820 is connected in series with the MOSFET 810 between the power supply voltage VCC and the reference potential PGND (the emitter potential of the switching device 15), and the control signal OUTOFF from the input buffer 120 is input to the gate. The MOSFET 820 is turned off when the control signal OUTOFF is 0. In this case, the MOSFET 810 outputs the driving current to the control terminal G of the switching device 15. The MOSFET 820 is turned on when the control signal OUTOFF is 1, and connects the control terminal G of the switching device 15 to the reference potential PGND and turns off the switching device 15.

The MOSFET 830, the resistor 840, and the differential amplifier circuit 850 are a current control circuit that supplies a current corresponding to the control voltage IDREF from the voltage output circuit 160 to the current mirror circuit constituted of the MOSFET 800 and the MOSFET 810. The MOSFET 830 and the resistor 840 are connected in series between the drain of the MOSFET 800 and the reference potential PGND. In the differential amplifier circuit 850, the control voltage IDREF is input to a positive terminal, and a voltage between the MOSFET 830 and the resistor 840 is input to a negative terminal. An output terminal of the differential amplifier circuit 850 is connected to the gate of the MOSFET 830. When the control signal OUTOFF is 0, the differential amplifier circuit 850 controls the MOSFET 830 such that a potential between the MOSFET 830 and the resistor 840 becomes a potential of the control voltage IDREF. Accordingly, when the control signal OUTOFF is 0, the resistor 840 causes the current i1 having a current value obtained by dividing the control voltage IDREF by a resistance value of the resistor 840 to flow through a path of the MOSFET 800, the MOSFET 830, and the resistor 840.

The MOSFET 860 is connected between the gate of the MOSFET 830 and the reference potential PGND, and the control signal OUTOFF is input to the gate. The MOSFET 860 is turned off when the control signal OUTOFF is 0. The MOSFET 860 is turned on when the control signal OUTOFF is 1, and the MOSFET 830 is forcibly turned off so as not to cause a current to flow in the MOSFET 800 (current i1=0).

When the control voltage OUTOFF is 0, the switching circuit 170 described above can supply a driving current obtained by amplifying the current corresponding to the control voltage IDREF by the current mirror circuit to the switching device 15, to thus turn on the switching device 15. Further, when the control voltage OUTOFF is 1, the switching device 15 can be turned off by setting the control terminal G of the switching device 15 to be the reference potential PGND.

Figure 9:
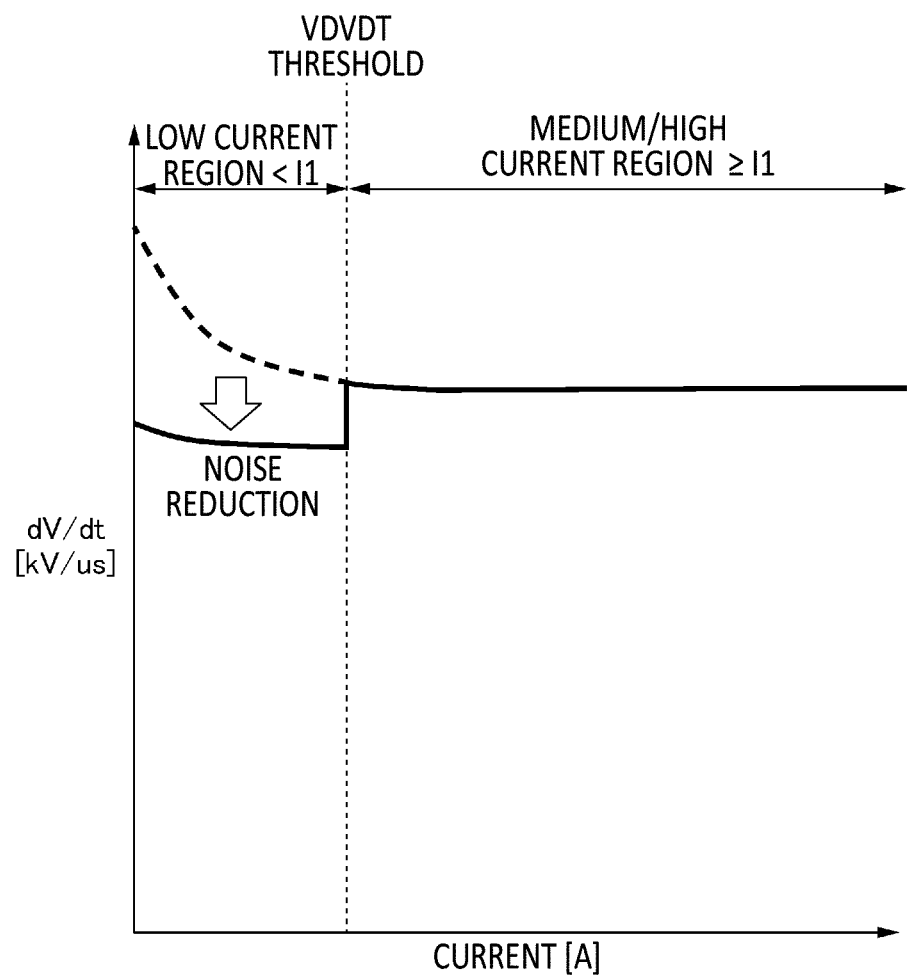
FIG. 9 shows a noise reduction effect in a low current region in the apparatus 5 according to the present embodiment.

FIG. 9 shows a noise reduction effect in a low current region in the apparatus 5 according to the present embodiment in the case of temperature<T1. When the temperature detection signal TL from the temperature detection circuit 130 is the logic 1 and TM and TH are the same logic 0, the driving circuit 150 decreases the driving current according to the current detection signal ILOW indicating a smaller current regarding the main current that flows in the switching device 15.

More specifically, when the current detection signal ILOW sampled during the ON period of the switching device 15 is 0, the switching device 15 causes a current of I1 or more to flow during the ON period (the medium/high current region in the figure). When the current detection signal ILOW is 1, the switching device 15 causes a current smaller than I1 to flow during the ON period (the low current region in the figure). When the switching device 15 is used in the low current region in which the current smaller than I1 is caused to flow during the ON period, the driving apparatus 100 lowers the control voltage IDREF from the voltage V3 to the voltage V4, to thus lower the driving current to be supplied to the switching device 15.

In this manner, when the switching device 15 is used in the low current region, the driving apparatus 100 lowers a switching speed dv/dt of the switching device 15 as compared to a case where the switching device 15 is used in the medium/high current region. Accordingly, the driving apparatus 100 can reduce noises as compared to the case of not lowering the switching speed of the switching device 15 (the broken line in the figure).

Figure 10:
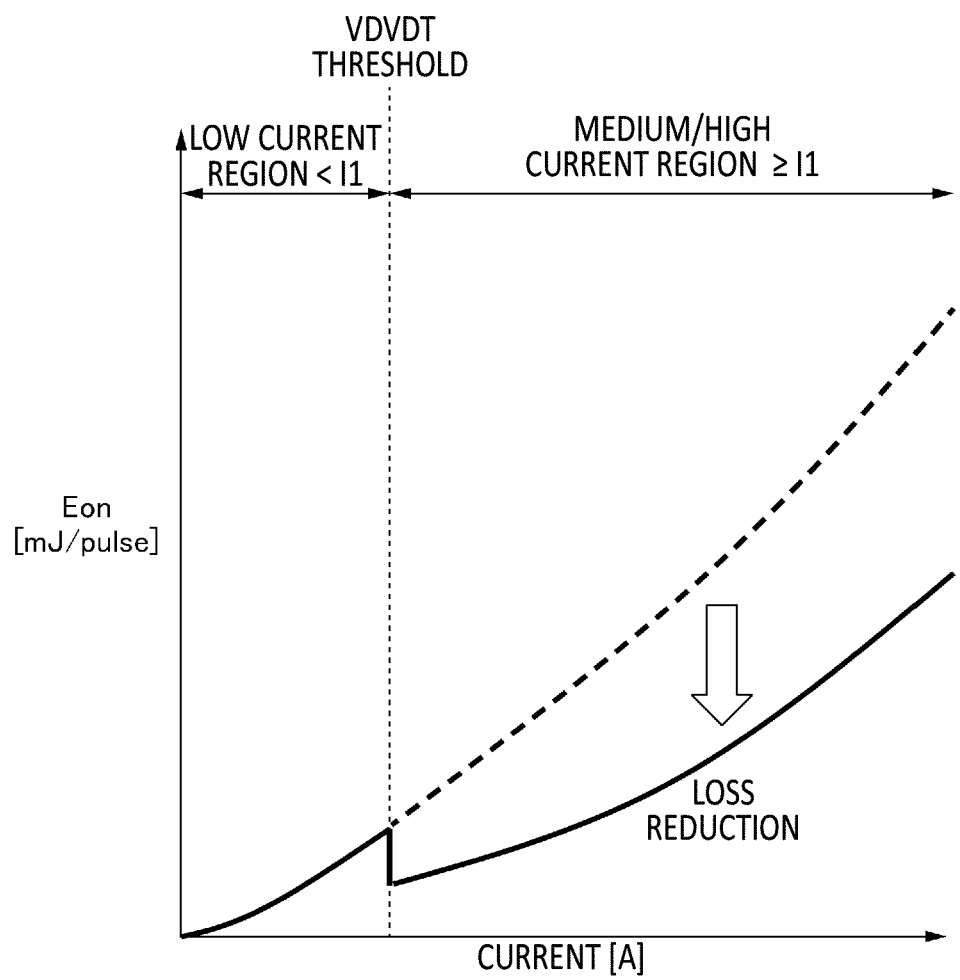
FIG. 10 shows a loss reduction effect in a medium/high current region in the apparatus 5 according to the present embodiment.

FIG. 10 shows a loss reduction effect in the medium/high current region in the apparatus 5 according to the present embodiment in the case of temperature<T1. In the case of temperature<T1, the driving circuit 150 sets the control voltage IDREF to the voltage V4 when the switching device 15 is used in the low current region in which the current smaller than I1 is caused to flow during the ON period. Herein, in a case where the driving currents are the same, when the switching device 15 is used in the medium/high current region in which the current of I1 or more is caused to flow during the ON period, a switching loss Eon becomes larger than when used in the low current region.

In the present embodiment, when the switching device 15 is used in the medium/high current region in which the current of I1 or more is caused to flow during the ON period, the driving circuit 150 sets the control voltage IDREF to the voltage V3, and increases the driving current to be supplied to the switching device 15. Accordingly, the driving circuit 150 can reduce the switching loss of the switching device 15.

Figure 11:
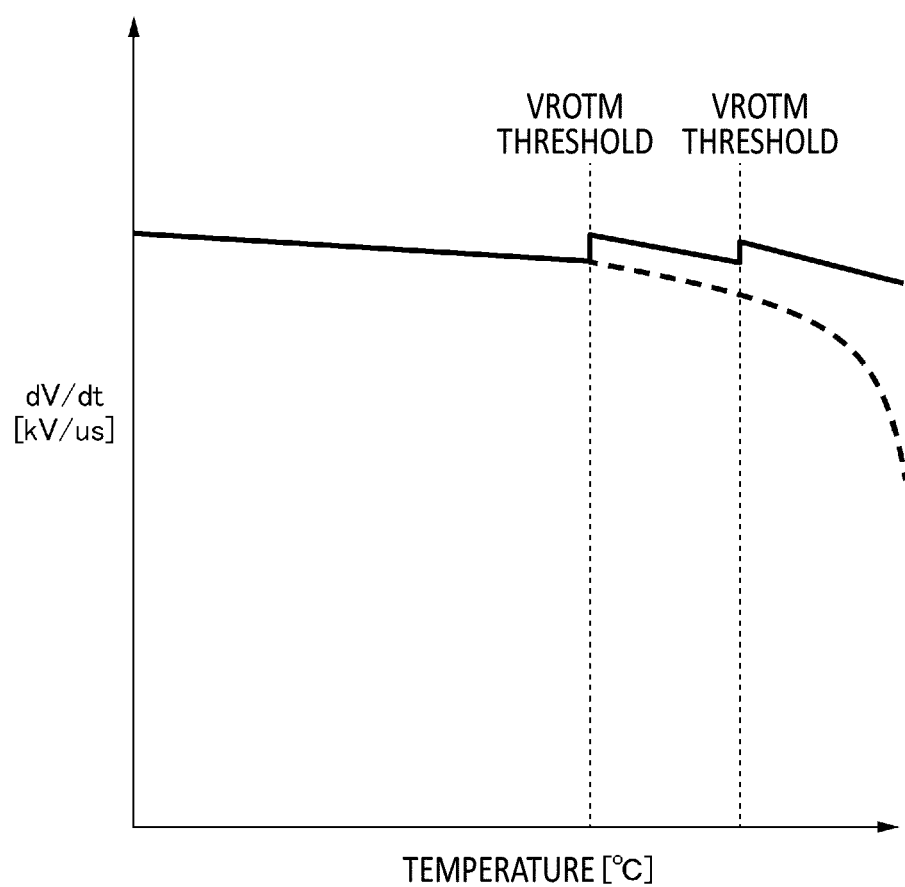
FIG. 11 shows a switching speed corresponding to the temperature in the apparatus 5 according to the present embodiment.

FIG. 11 shows the switching speed corresponding to the temperature in the apparatus 5 according to the present embodiment. In the switching device 15, the switching speed dv/dt decreases as the temperature increases, and noises are lowered accordingly (the broken line in the figure). In the present embodiment, at a point at which a state where the detection value OT of the temperature sensor 40 exceeds the threshold VROTM is switched to a state where it is equal to or smaller than the threshold VROTM (a point of switch from temperature<T1 (TL=1) to temperature T1≥ (TM=1)), the driving circuit 150 increases the control voltage IDREF from V3 or V4 to V2, to thus increase the driving current of the switching device 15. Further, at a point at which a state where the detection value OT of the temperature sensor 40 exceeds the threshold VROTH is switched to a state where it is equal to or smaller than the threshold VROTH (a point of switch from temperature<T2 (TM=1) to temperature≥T2 (TH=1)), the driving circuit 150 increases the control voltage IDREF from V2 to V1, to thus increase the driving current of the switching device 15.

In this manner, when the current detection signals ILOW are the same, the driving circuit 150 decreases the driving current according to the temperature detection signal TL/TM/TH indicating a lower temperature of the switching device 15, and increases the driving current according to the temperature detection signal TL/TM/TH indicating a higher temperature of the switching device 15. Along with this, the driving circuit 150 suppresses lowering of the switching speed dv/dt of the switching device 15 accompanying the increase of the temperature.

Figure 12:
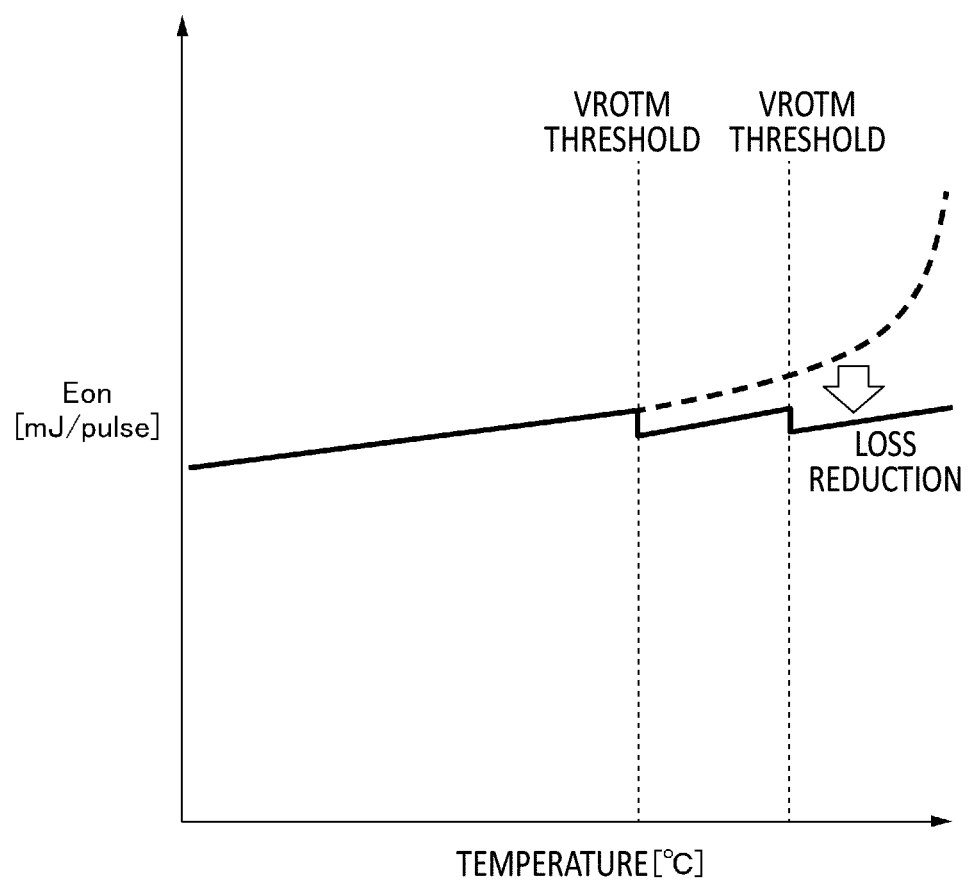
FIG. 12 shows a loss reduction effect corresponding to the temperature in the apparatus 5 according to the present embodiment.

FIG. 12 shows a loss reduction effect corresponding to the temperature in the apparatus 5 according to the present embodiment. In the switching device 15, the switching speed dv/dt decreases as the temperature increases, and the switching loss increases accordingly (the broken line in the figure). As shown in relation to FIG. 11, the driving circuit 150 increases the driving current according to the temperature detection signal TL/TM/TH indicating a higher temperature of the switching device 15, and increases the switching speed dv/dt. Accordingly, the driving circuit 150 can reduce the switching loss of the switching device 15 accompanying the increase of the temperature.

If the parameters such as the threshold voltages VROTH and VROTM and the voltages V1 to V4 are set appropriately according to the purpose of use, the driving apparatus 100 described above can appropriately reduce the switching loss and switching noises of the switching device 15 according to the temperature of the switching device 15 and the current that flows in the switching device 15 during the ON period.

In the present embodiment, in response to the temperature indicated by the temperature detection signal TL/TM/TH falling within a first temperature range (for example, T1 temperature<T2) out of a plurality of temperature ranges (for example, temperature<T1, T1 temperature<T2, and temperature T2), the driving apparatus 100 can set the magnitude of the driving current to a magnitude associated with the first temperature range irrespective of the value of the current detection signal ILOW. Further, in response to the temperature indicated by the temperature detection signal falling within a second temperature range (for example, temperature<T1) out of the plurality of temperature ranges, the driving apparatus 100 can adjust the magnitude of the driving current according to the value of the current detection signal ILOW. For example, in a usage environment where the temperature of the switching device 15 becomes equal to or larger than a particular temperature threshold in accordance with a flow of a relatively high current during the ON period of the switching device 15, the magnitude of the driving current can be set irrespective of the value of the current detection signal in at least one of the temperature ranges so as to reduce the types of the magnitude of the driving current.

In the present embodiment, such a second temperature range is a temperature range having a lowest temperature (temperature<T1) out of the plurality of temperature ranges, and the first temperature range is a temperature range other than the temperature range having the lowest temperature (T1≤temperature<T2 and temperature≥T2) out of the plurality of temperature ranges. For example, in a usage form in which temperature≥T1 is established when a relatively high current (current I1) is caused to flow during the ON period, or the like, by controlling the magnitude of the driving current according to the current detection signal ILOW in only the temperature range having the lowest temperature, the switching device 15 can reduce the types of the magnitude of the driving current.

Figure 13:
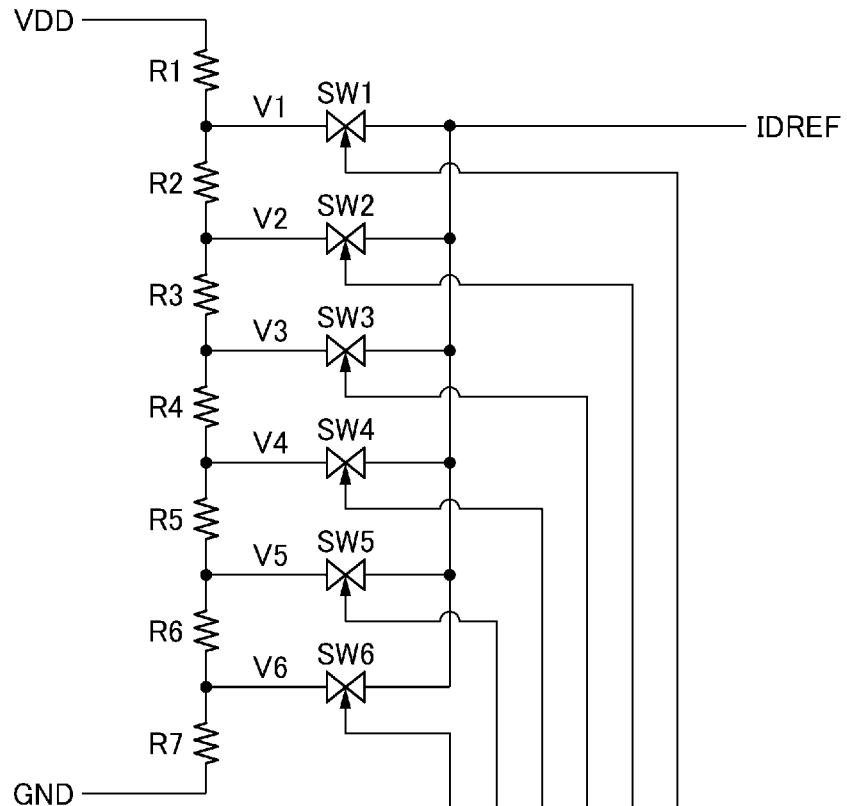
FIG. 13 shows a configuration of a voltage output circuit 1300 according to a first modified example of the present embodiment.
Figure 13:
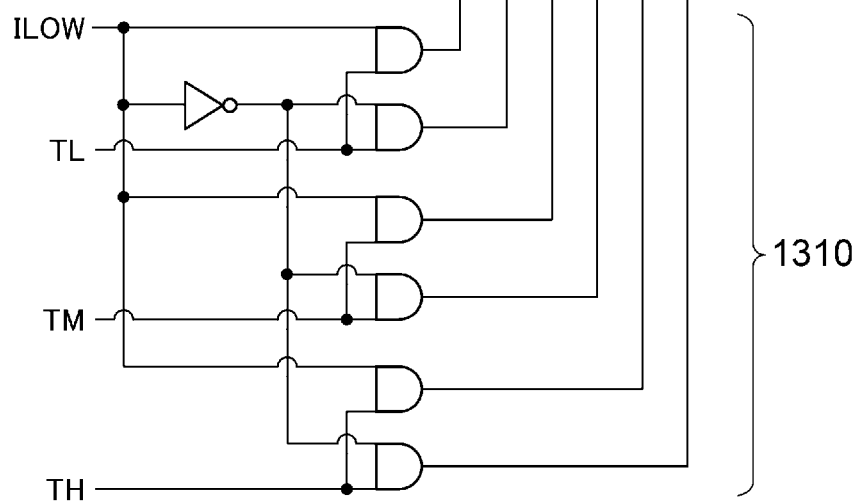

FIG. 13 shows a configuration of a voltage output circuit 1300 according to a first modified example of the present embodiment. In the present modified example, the voltage output circuit 1300 is used in place of the voltage output circuit 160 in the apparatus 5 shown in FIG. 1. Other components in the apparatus 5 are similar to those of FIGS. 1 to 5 and 8, so descriptions thereof will be omitted below except for different points.

The voltage output circuit 1300 includes a variable resistor circuit constituted of a plurality of resistors R1 to R7 and a plurality of switches SW1 to SW6, and a decoder circuit 1310. The plurality of resistors R1 to R7 are connected in series between the power supply voltage VDD and the reference potential (the ground potential in the example shown in the present figure), and divide the power supply voltage VDD. The plurality of switches SW1 to SW6 are respectively connected between the respective resistors, that is, the plurality of resistors R1 to R7, and the output of the voltage output circuit 1300. The decoder circuit 1310 decodes the temperature detection signal TL/TM/TH and the current detection signal ILOW, and outputs a signal for turning on/off each of the switches SW1 to SW6.

FIG. 14 shows an input/output of the voltage output circuit 1300 according to the first modified example of the present embodiment. In the present modified example, the voltage output circuit 1300 sets the control voltage IDREF at a magnitude associated with a combination of a temperature range including a temperature indicated by the temperature detection signal TL/TM/TH out of the plurality of temperature ranges and a current range including a current value indicated by the current detection signal ILOW out of the plurality of current ranges, and thus sets the magnitude of the driving current of the switching device 15 to a magnitude associated with the combination of these temperature range and current range. As shown in the present figure, in all of the temperature ranges, the voltage output circuit 1300 may change the control voltage IDREF according to which of the plurality of current ranges the current value indicated by the current detection signal ILOW falls within.

In the case of temperature detection signal TH=1 (temperature≥T2), the decoder circuit 1310 shown in FIG. 13 turns on the switch SW1 and sets the control voltage IDREF to the voltage V1 when current detection signal ILOW=0 is established, and turns on the switch SW2 and sets the control voltage IDREF to the voltage V2 when current detection signal ILOW=1 is established. In the case of temperature detection signal TM=1 (T1≤temperature<T2), the decoder circuit 1310 turns on the switch SW3 and sets the control voltage IDREF to the voltage V3 when current detection signal ILOW=0 is established, and turns on the switch SW4 and sets the control voltage IDREF to the voltage V4 when current detection signal ILOW=1 is established. In the case of temperature detection signal TL=1 (temperature<T1), the decoder circuit 1310 turns on the switch SW5 and sets the control voltage IDREF to the voltage V5 when current detection signal ILOW=0 is established, and turns on the switch SW6 and sets the control voltage IDREF to the voltage V6 when current detection signal ILOW=1 is established.

In the present modified example, the driving apparatus 100 can set the magnitude of the driving current of the switching device 15 with respect to each combination of the temperature range and the current range. Accordingly, the driving apparatus 100 can be configured to be capable of more-flexibly adjusting the magnitude of the driving current according to the temperature of the switching device 15 and the magnitude of the current that flows in the switching device 15 during the ON period.

Figure 15:
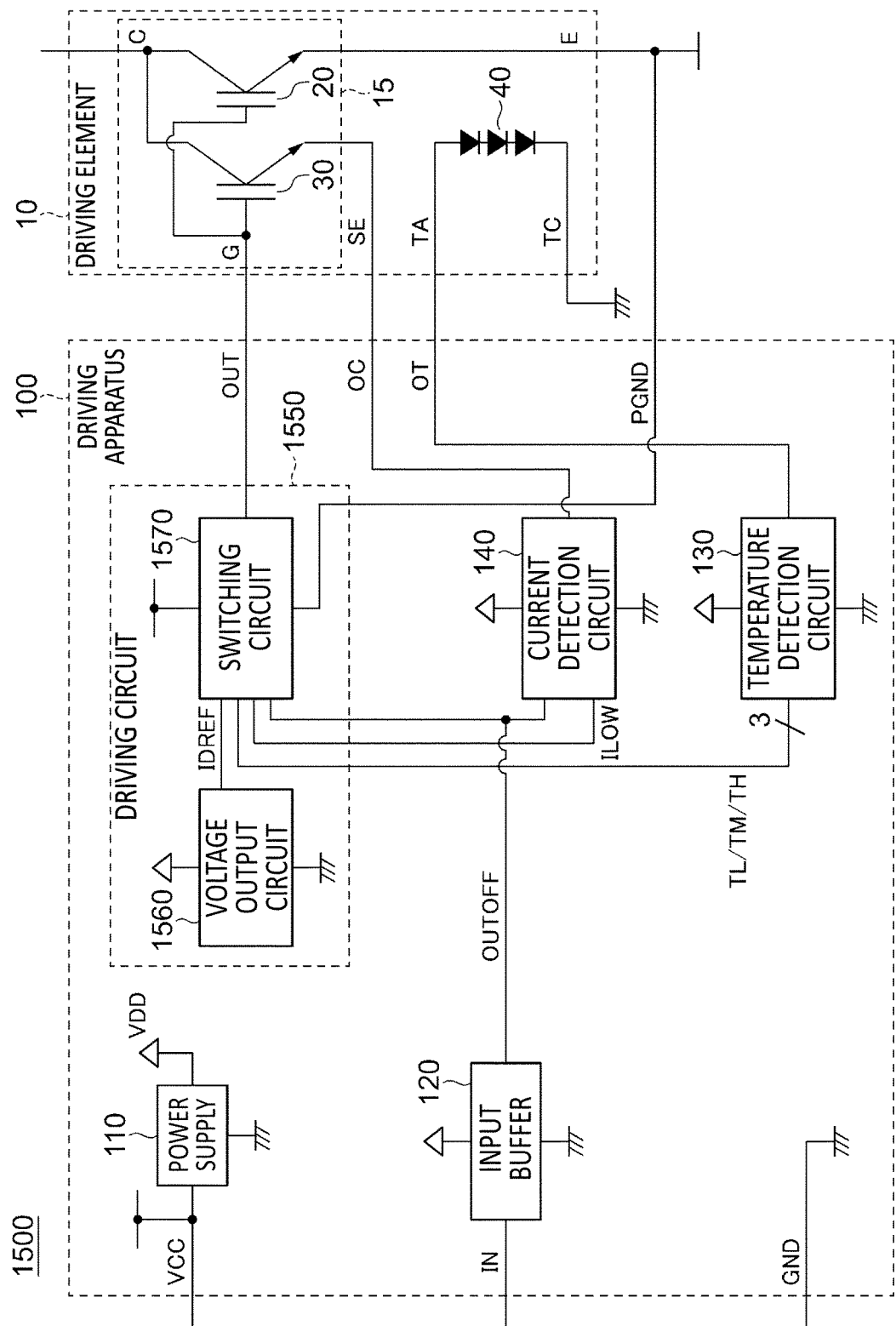
FIG. 15 shows a configuration of an apparatus 1500 according to a second modified example of the present embodiment.

FIG. 15 shows a configuration of an apparatus 1500 according to a second modified example of the present embodiment. The apparatus 1500 uses a driving circuit 1550 in place of the driving circuit 150 shown in FIG. 1. Other components in the apparatus 1500 denoted by the same reference numerals as in FIG. 1 are similar to those of FIGS. 1 to 5, so descriptions thereof will be omitted below except for different points.

The driving circuit 1550 includes a voltage output circuit 1560 and a switching circuit 1570. The voltage output circuit 1560 outputs a reference voltage IDREF of a constant voltage. The switching circuit 1570 is input with the reference voltage IDREF, the temperature detection signal TL/TM/TH, and the current detection signal ILOW. The switching circuit 1570 adjusts, according to the temperature detection signal TL/TM/TH and the current detection signal ILOW, the driving current to be supplied to the control terminal G of the switching device 15, to thus change the switching speed of the switching device 15.

Figure 16:
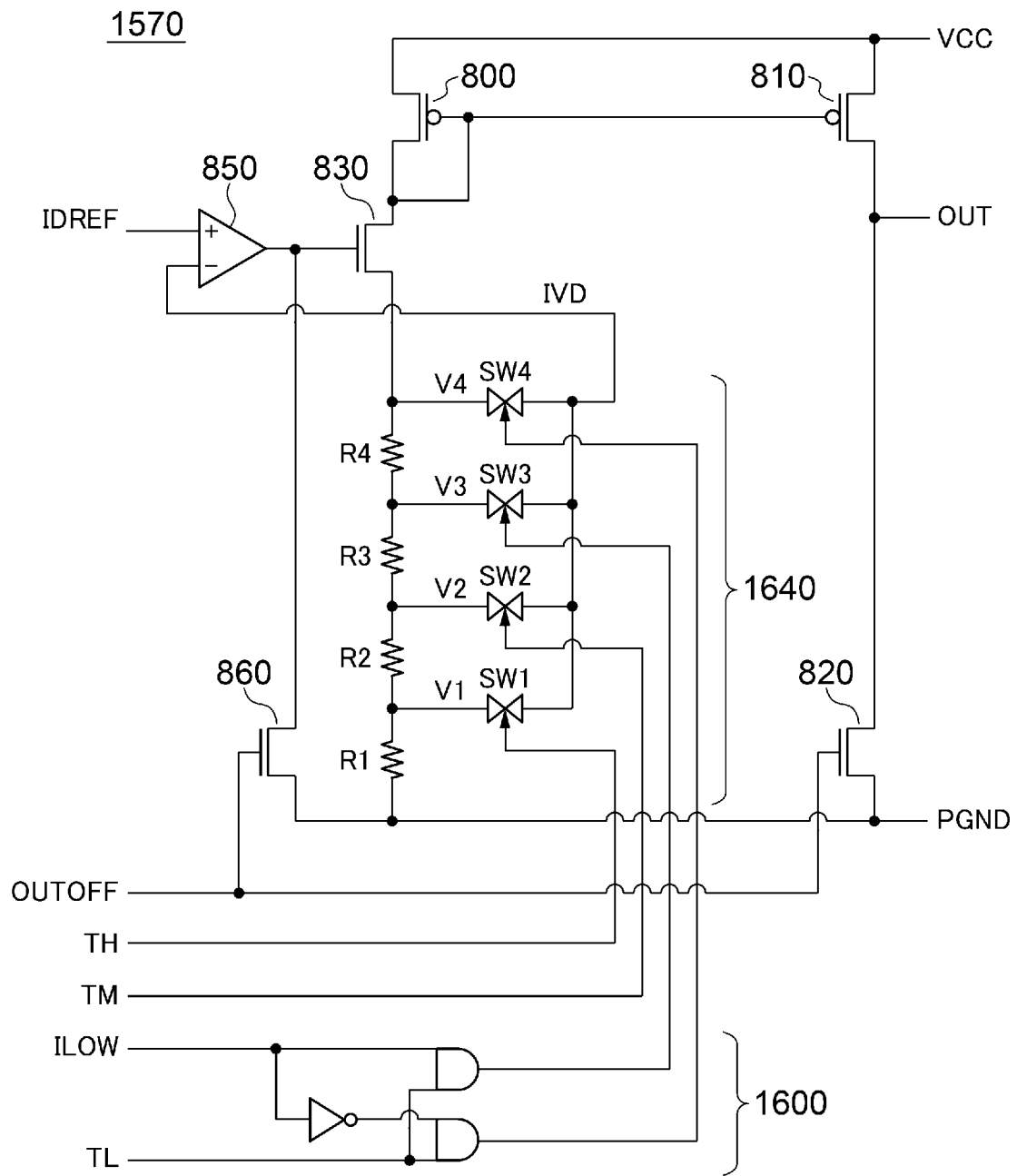
FIG. 16 shows a configuration of a switching circuit 1570 according to the second modified example of the present embodiment.

FIG. 16 shows a configuration of the switching circuit 1570 according to the second modified example of the present embodiment. The switching circuit 1570 includes the MOSFET 800, the MOSFET 810, the MOSFET 820, the MOSFET 830, a variable resistor 1640, the differential amplifier circuit 850, the MOSFET 860, and a decoder circuit 1600. Similar to the MOSFET 800 and the MOSFET 810 shown in FIG. 8, the MOSFET 800 and the MOSFET 810 function as a current mirror circuit that outputs a driving current obtained by amplifying a current supplied to the MOSFET 800. The MOSFET 820 is similar to the MOSFET 820 shown in FIG. 8.

The MOSFET 830, the variable resistor 1640, the differential amplifier circuit 850, and the decoder circuit 1600 are a current control circuit that supplies a current corresponding to the temperature detection signal TL/TM/TH and the current detection signal ILOW to the current mirror circuit constituted of the MOSFET 800 and the MOSFET 810. The MOSFET 830 and the variable resistor 1640 are connected in series between the drain of the MOSFET 800 and the reference potential PGND.

The variable resistor 1640 includes the plurality of resistors R1 to R4 and the plurality of switches SW1 to SW4. The plurality of resistors R1 to R4 are connected in series between the reference potential (the ground potential in the example shown in the present figure) and the source of the MOSFET 830, and divide a source voltage of the MOSFET 830. The plurality of switches SW1 to SW4 are respectively connected between end portions of the respective resistors, that is, the plurality of resistors R1 to R4, on the MOSFET 830 side and the negative terminal of the differential amplifier circuit 850.

In the differential amplifier circuit 850, the reference voltage IDREF is input to the positive terminal. Further, in the differential amplifier circuit 850, a voltage selected, by the plurality of switches SW1 to SW4, from the plurality of voltages V1 to V4 obtained by dividing the source voltage of the MOSFET 830 by the plurality of resistors R1 to R4, is input to the negative terminal. The output terminal of the differential amplifier circuit 850 is connected to the gate of the MOSFET 830.

The decoder circuit 1600 decodes the temperature detection signal TL/TM/TH and the current detection signal ILOW, and outputs a signal for turning on/off each of the switches SW1 to SW4. Operations of the decoder circuit 1600 are similar to those of the decoder circuit 600 shown in FIGS. 6 and 7. In the case of temperature detection signal TH=1 (logic 1) (in the case of temperature≥T2), the decoder circuit 1600 turns on the switch SW1 shown in FIG. 16. At this time, the decoder circuit 1600 turns off the switches SW2 to SW4. Accordingly, the variable resistor 1640 supplies the voltage V1 between the resistors R1 and R2 to the negative terminal of the differential amplifier circuit 850 as a feedback voltage IVD. In this case, the differential amplifier circuit 850 controls the MOSFET 830 such that the voltage V1 becomes the reference voltage IDREF. As a result, the current control circuit supplies the current IDREF/R1 to the current mirror circuit.

In the case of temperature detection signal TM=1 (in the case of T1 temperature<T2), the decoder circuit 1600 turns on the switch SW2 shown in FIG. 16. At this time, the decoder circuit 1600 turns off the switches SW1, SW3, and SW4. Accordingly, the variable resistor 1640 supplies the voltage V2 between the resistors R2 and R3 to the negative terminal of the differential amplifier circuit 850 as the feedback voltage IVD. In this case, the differential amplifier circuit 850 controls the MOSFET 830 such that the voltage V2 becomes the reference voltage IDREF. As a result, the current control circuit supplies the current IDREF/(R1+R2) to the current mirror circuit.

In the case of temperature detection signal TL=1 (in the case of temperature<T1), when current detection signal ILOW=0 (current≥I1) is established, the decoder circuit 1600 turns on the switch SW3 shown in FIG. 16. At this time, the decoder circuit 1600 turns off the switches SW1, SW2, and SW4. Accordingly, the variable resistor 1640 supplies the voltage V3 between the resistors R3 and R4 to the negative terminal of the differential amplifier circuit 850 as the feedback voltage IVD. In this case, the differential amplifier circuit 850 controls the MOSFET 830 such that the voltage V3 becomes the reference voltage IDREF. As a result, the current control circuit supplies the current IDREF/(R+R2+R3) to the current mirror circuit.

In the case of temperature detection signal TL=1 (in the case of temperature<T1), when current detection signal ILOW=1 (current<I1) is established, the decoder circuit 1600 turns on the switch SW4 shown in FIG. 16. At this time, the decoder circuit 1600 turns off the switches SW1 to SW3. Accordingly, the variable resistor 1640 supplies the voltage V4 between the resistor R4 and the source of the MOSFET 830 to the negative terminal of the differential amplifier circuit 850 as the feedback voltage IVD. In this case, the differential amplifier circuit 850 controls the MOSFET 830 such that the voltage V4 becomes the reference voltage IDREF. As a result, the current control circuit supplies the current IDREF/(R1+R2+R3+R4) to the current mirror circuit. The MOSFET 860 is similar to the MOSFET 860 shown in FIG. 8.

According to the switching circuit 1570 of the present modified example, by providing the variable resistor 1640 between the MOSFET 830 and the reference potential PGND instead of generating the control voltage IDREF corresponding to the temperature detection signal and the current detection signal by the voltage output circuit 160, the driving current of the switching device 15 can be controlled according to the temperature detection signal and the current detection signal.

Figure 17:
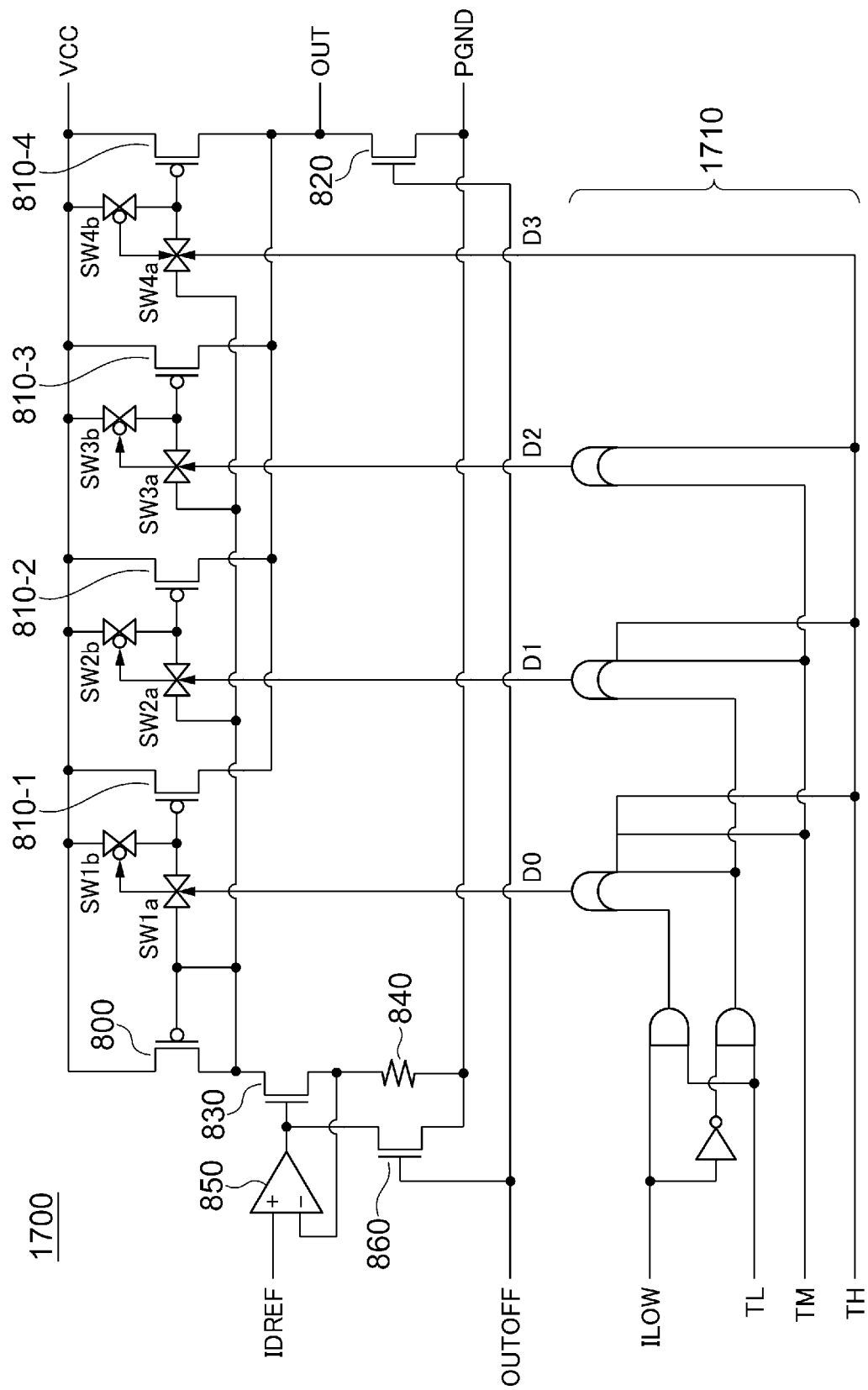
FIG. 17 shows a configuration of a switching circuit 1700 according to a third modified example of the present embodiment.

FIG. 17 shows a configuration of a switching circuit 1700 according to a third modified example of the present embodiment. The switching circuit 1700 may be used in place of the switching circuit 1570 shown in FIG. 15. In the present figure, components denoted by the same reference numerals as in FIG. 8 are similar to those of FIG. 8, so descriptions thereof will be omitted below except for different points.

The switching circuit 1700 includes the MOSFET 800, a plurality of MOSFETs 810-1 to 810-4 (hereinafter, will also be referred to as "MOSFETs 810"), switches SW1a to SW4a, switches SW1b to SW4b, the MOSFET 820, the MOSFET 830, the resistor 840, the differential amplifier circuit 850, the MOSFET 860, and a decoder circuit 1710. The MOSFET 800, the plurality of MOSFETs 810-1 to 810-4, the switches SW1a to SW4a, and the switches SW1b to SW4b function as a current mirror circuit that outputs a driving current obtained by amplifying a current supplied to the MOSFET 800. The source of the MOSFET 800 is connected to the power supply voltage VCC, and thus a connection is made between the gate and the drain. In the MOSFETs 810-1 to 810-4, gates are connected to the power supply voltage VCC via the switches SW1b to SW4b, respectively, the gates are connected to the gate of the MOSFET 800 via the switches SW1a to SW4a, respectively, and drains are connected to the control terminal G of the switching device 15 as the output of the switching circuit 170. The switches SW1a to SW4a are turned on when signals D0 to D3 respectively become the logic 1, and are turned off when the signals D0 to D3 respectively become the logic 0. The switches SW1b to SW4b are turned on when the signals D0 to D3 respectively become the logic 0, and are turned off when the signals D0 to D3 respectively become the logic 1.

When a corresponding one of the signals D0 to D3 is the logic 1, similar to the MOSFET 810 shown in FIG. 8, each MOSFET 810 amplifies the current that flows in the MOSFET 800 and outputs it to the control terminal G of the switching device 15. When a corresponding input out of the inputs of the signals D0 to D3 is the logic 0, each MOSFET 810 is turned off and does not cause a current to flow. Accordingly, regarding the current mirror circuit including the plurality of MOSFETs 810, a current gain factor is variable according to the values of the signals D0 to D3.

The MOSFET 820, the MOSFET 830, the resistor 840, the differential amplifier circuit 850, and the MOSFET 860 are similar to the components denoted by the same reference numerals in FIG. 8. It is to be noted that in the present modified example, the differential amplifier circuit 850 is input with the reference voltage IDREF of a constant voltage.

The decoder circuit 1710 functions as a gain factor setting circuit that sets a gain factor of the current mirror circuit according to the temperature detection signal TL/TM/TH and the current detection signal ILOW. The decoder circuit 1710 decodes the temperature detection signal TL/TM/TH and the current detection signal ILOW, and outputs the signals D0 to D3 for turning on/off the switches SW1a to SW4a and the switches SW1b to SW4b, respectively.

FIG. 18 shows an input/output of the decoder circuit 1710 according to the third modified example of the present embodiment. In the case of temperature detection signal TH=1 (logic 1) (in the case of temperature T2), the decoder circuit 1710 sets the signals D0 to D3 to be the logic 1. Accordingly, the switches SW1a to SW4a are turned on and the switches SW1b to SW4b are turned off, and the MOSFETs 810-1 to 810-4 amplify the current that flows in the MOSFET 800. Therefore, the current gain factor of the current mirror circuit becomes a sum of the current gain factors of the respective MOSFETs 810-1 to 810-4.

In the case of temperature detection signal TM=1 (in the case of T1 temperature<T2), the decoder circuit 1710 sets the signals D0 to D2 to be the logic 1, and sets the signal D3 to be the logic 0. Accordingly, the switches SW1a to SW3a are turned on, the switch SW4a is turned off, the switches SW1b to SW3b are turned off, and the switch SW4b is turned on, and the MOSFETs 810-1 to 810-3 amplify the current that flows in the MOSFET 800. Therefore, the current gain factor of the current mirror circuit becomes a sum of the current gain factors of the respective MOSFETs 810-1 to 810-3.

In the case of temperature detection signal TL=1 and also current detection signal ILOW=0 (in the case of temperature<T1 and also current indicated by current detection signal ILOW≥I1), the decoder circuit 1710 sets the signals D0 and D1 to be the logic 1, and sets the signals D2 and D3 to be the logic 0. Accordingly, the switches SW1a and SW2a are turned on, the switches SW3a and SW4a are turned off, the switches SW1b and SW2b are turned off, and the switches SW3b and SW4b are turned on, and the MOSFETs 810-1 and 810-2 amplify the current that flows in the MOSFET 800. Therefore, the current gain factor of the current mirror circuit becomes a sum of the current gain factors of the respective MOSFETs 810-1 and 810-2.

In the case of temperature detection signal TL=1 and also current detection signal ILOW=1 (in the case of temperature<T1 and also current indicated by current detection signal ILOW<I1), the decoder circuit 1710 sets the signal D0 to be the logic 1, and sets the signals D1 to D3 to be the logic 0. Accordingly, the switch SW1a is turned on, the switches SW2a to SW4a are turned off, the switch SW1b is turned off, and the switches SW2b to SW4b are turned on, and the MOSFET 810-1 amplifies the current that flows in the MOSFET 800. Therefore, the current gain factor of the current mirror circuit becomes the same as the current gain factor of the MOSFET 810-1.

According to the switching circuit 1570 of the present modified example, by using the current mirror circuit including the MOSFET 800 and the plurality of MOSFETs 810 instead of generating the control voltage IDREF corresponding to the temperature detection signal and the current detection signal by the voltage output circuit 160 shown in FIG. 1, the driving current of the switching device 15 can be controlled according to the temperature detection signal and the current detection signal.

It is to be noted that in the example shown in the present figure, the decoder circuit 1710 always sets the signal D0 to be the logic 1. When performing such control, the switching circuit 1700 may adopt a configuration in which the switches SW1a to b are not provided and the gate of the MOSFET 810-1 is connected to the gate of the MOSFET 800. Further, the decoder circuit 1710 does not need to include a circuit portion that outputs the signal D0.

Figure 19:
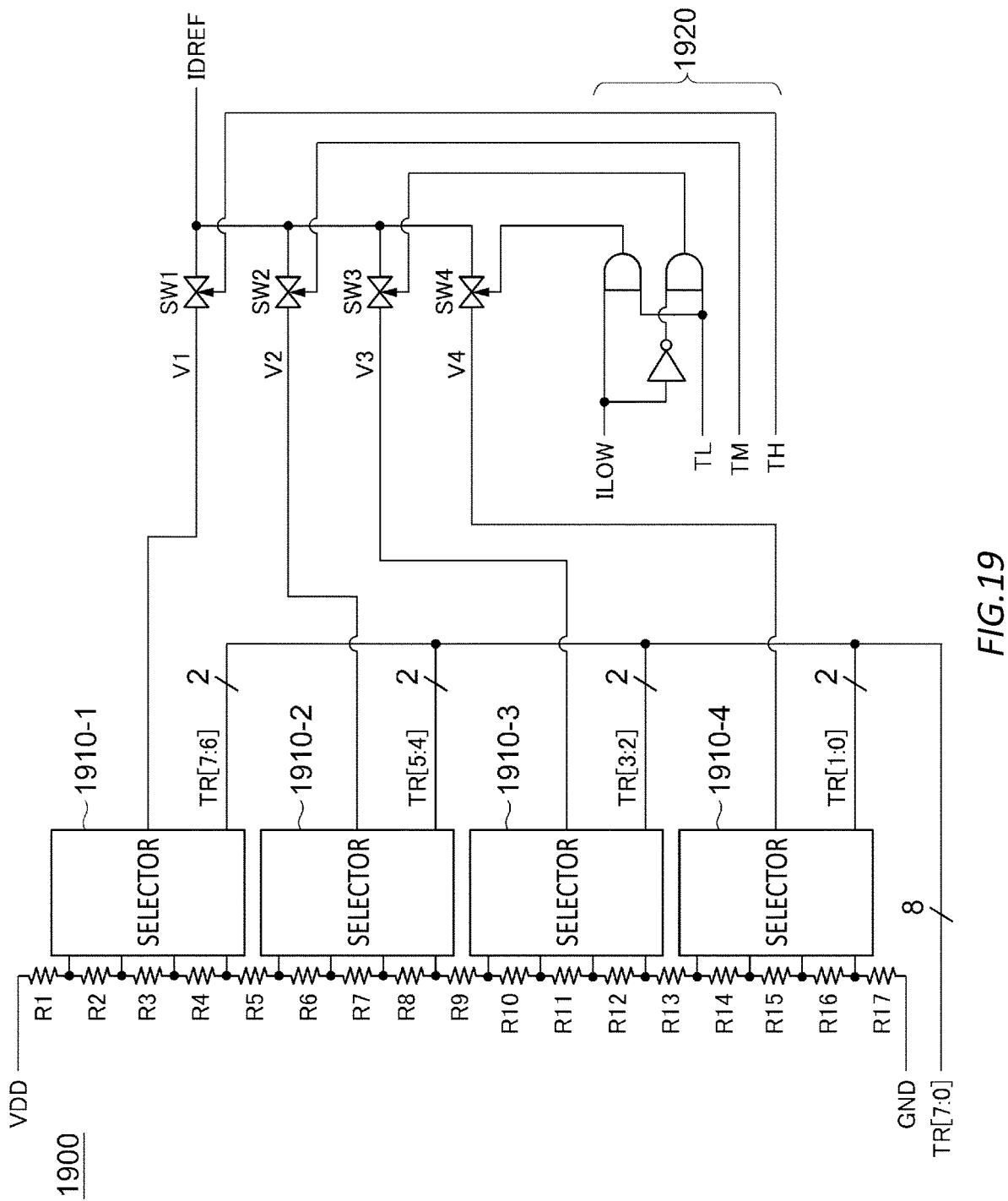
FIG. 19 shows a configuration of a voltage output circuit 1900 according to a fourth modified example of the present embodiment.

FIG. 19 shows a configuration of a voltage output circuit 1900 according to a fourth modified example of the present embodiment. In the present modified example, the voltage output circuit 1900 is used in place of the voltage output circuit 160 in the apparatus 5 shown in FIGS. 1 and 6. Other components in the apparatus 5 are similar to those of FIGS. 1 to 5 and 8, so descriptions thereof will be omitted below except for different points.

The voltage output circuit 1900 according to the present modified example is capable of presetting the control voltage IDREF output by the voltage output circuit 1900 according to the temperature detection signal TL/TM/TH and the current detection signal ILOW using a predesignated trimming signal TR [7:0]. The trimming signal TR [7:0] may be input from outside the driving apparatus 100, or may be set by a register or the like in the driving apparatus 100.

The voltage output circuit 1900 includes a variable resistor circuit constituted of a plurality of resistors R1 to R17, a plurality of selectors 1910-1 to 1910-4 (also referred to as "selectors 1910"), and the plurality of switches SW1 to SW4, and a decoder circuit 1920. The plurality of resistors R1 to R17 are connected in series between the power supply voltage VDD and the reference potential (the ground potential in the example shown in the present figure), and divide the power supply voltage VDD. The selector 1910-1 is connected among the respective resistors of the resistors R1 to R5, and switches which of the voltages among the respective resistors of the resistors R1 to R5 is to be output as the voltage V1, according to a value of TR [7:6] out of the trimming signal TR [7:0]. For example, in the case of TR [7:6]=0b00 (0 in a binary number), the selector 1910-1 may output a voltage between the resistors R1 and R2 as the voltage V1. In the case of TR [5:4]=0b01 (1 in the binary number), the selector 1910-1 may output a voltage between the resistors R2 and R3 as the voltage V1. In the case of TR [7:6]=0b10 (2 in the binary number), the selector 1910-1 may output a voltage between the resistors R3 and R4 as the voltage V1. In the case of TR [7:6]=0b11 (0 in the binary number), the selector 1910-1 may output a voltage between the resistors R4 and R5 as the voltage V1.

The selector 1910-2 is connected among the respective resistors of the resistors R5 to R9, and switches which of the voltages among the respective resistors of the resistors R5 to R9 is to be output as the voltage V2, according to a value of TR [5:4] out of the trimming signal TR [7:0]. The selector 1910-3 is connected among the respective resistors of the resistors R9 to R13, and switches which of the voltages among the respective resistors of the resistors R9 to R13 is to be output as the voltage V3, according to a value of TR [3:2] out of the trimming signal TR [7:0]. The selector 1910-4 is connected among the respective resistors of the resistors R13 to R17, and switches which of the voltages among the respective resistors of the resistors R13 to R17 is to be output as the voltage V4, according to a value of TR [1:0] out of the trimming signal TR [7:0].

The plurality of switches SW1 to SW4 respectively switch which of the plurality of voltages V1 to V4 is to be output as the control voltage IDREF. The decoder circuit 1920 decodes the temperature detection signal TL/TM/TH and the current detection signal ILOW, and outputs a signal for turning on/off each of the switches SW1 to SW4. The input/output of the voltage output circuit 1900 is similar to the input/output of the voltage output circuit 160 shown in FIG. 7.

According to the voltage output circuit 1900 of the present modified example, the control voltage IDREF to be supplied to the switching circuit 170 can be made adjustable after manufacturing of the driving apparatus 100 according to the temperature detection signal TL/TM/TH and the current detection signal ILOW.

In each embodiment and each modified example described above, the driving apparatus 100 adjusts, according to the temperature detection signal and the current detection signal, the magnitude of the driving current for turning on the switching device 15 (the driving current that flows from the driving apparatus 100 to the control terminal G of the switching device 15) in a driving signal OUT that is supplied from the driving apparatus 100 to the switching device 15. Alternatively or in addition to this, the driving apparatus 100 may adjust, according to the temperature detection signal and the current detection signal, the magnitude of the driving current for turning off the switching device 15 (the driving current that flows from the control terminal G of the switching device 15 to the driving apparatus 100) in the driving signal OUT that is supplied from the driving apparatus 100 to the switching device 15.

Such a driving apparatus 100 can be realized by, for example, providing, in place of the MOSFET 820 in the switching circuit 170 shown in FIG. 8, an output stage MOSFET of the current mirror circuit that is turned off when the control signal OUTOFF is 0 and draws in a driving current obtained by amplifying a current corresponding to the temperature detection signal and the current detection signal from the control terminal G of the switching device 15 when the control signal OUTOFF is 1, or the like.

In each embodiment and each modified example described above, the temperature detection signal indicates which of the three temperature ranges the temperature of the switching device 15 falls within. Alternatively, the temperature detection signal may indicate which of temperature ranges in an arbitrary number of two or more the temperature of the switching device 15 falls within, or may indicate consecutive values corresponding to the temperature of the switching device 15. Moreover, in each embodiment and each modified example described above, the current detection signal indicates which of the two current ranges the current that flows in the switching device 15 during the ON period falls within. Alternatively, the current detection signal may indicate which of current ranges in an arbitrary number of two or more the current that flows in the switching device 15 during the ON period falls within, or may indicate consecutive values corresponding to the current that flows in the switching device 15. The driving circuit 150 or the driving circuit 1550 may adjust the magnitude of the driving current of the switching device 15 according to a combination of values that the temperature detection signal and the current detection signal may take.

While the embodiment of the present invention has been described, the technical scope of the present invention is not limited to the above described embodiment. It is apparent to persons skilled in the art that various alterations and improvements can be added to the above described embodiment. It is also apparent from the description of the claims that the embodiments to which such alterations or improvements are made can be included in the technical scope of the present invention.

The operations, procedures, steps, and stages of each process performed by an apparatus, system, program, and method shown in the claims, specification, or drawings can be performed in any order as long as the order is not indicated by "prior to," "before," or the like and as long as the output from a previous process is not used in a later process. Even if the process flow is described using phrases such as "first" or "next" in the claims, specification, or drawings, it does not necessarily mean that the process must be performed in this order.

EXPLANATION OF REFERENCES

5: apparatus;
10: driving element;
15: switching device;
20: main switching device;
30: sense switching device;
40: temperature sensor;
100: driving apparatus;
110: power supply;
120: input buffer;
130: temperature detection circuit;
140: current detection circuit;
150: driving circuit;
160: voltage output circuit;
170: switching circuit;
200-1~2: comparator;
210-1~2: timer;
220: decoder;
500: comparator;
510: flip-flop;
600: decoder circuit;
800: MOSFET;
810-1~4: MOSFET;
820: MOSFET;
830: MOSFET;
840: resistance;
850: differential amplifier circuit;
860: MOSFET;
1300: voltage output circuit;
1310: decoder circuit;
1500: apparatus;
1550: driving circuit;
1560: voltage output circuit;
1570: switching circuit;
1600: decoder circuit;
1640: variable resistor;
1700: switching circuit;
1710: decoder circuit;
1900: voltage output circuit;
1910-1~4: selector;
1920: decoder circuit.

What is claimed is:

1. A driving apparatus comprising:
a temperature detection circuit configured to output a temperature detection signal corresponding to a temperature of a switching device;
a current detection circuit configured to sample, at a timing during an ON period of the switching device, a current detection signal corresponding to a main current that flows in the switching device; and
a driving circuit configured to set a magnitude of a driving current to be supplied to a control terminal of the switching device to a magnitude associated with a first temperature range irrespective of a value of the current detection signal, and to adjust a magnitude of the driving current according to the value of the current detection signal.

2. The driving apparatus according to claim 1, wherein the driving circuit is further configured to decrease the driving current according to the temperature detection signal indicating a lower temperature of the switching device.

3. The driving apparatus according to claim 2, wherein the driving circuit is configured to decrease the driving current according to the current detection signal indicating a smaller current regarding the main current.

4. A driving apparatus, comprising:
a temperature detection circuit configured to output a temperature detection signal corresponding to a temperature of a switching device;
a current detection circuit configured to sample, at a timing during an ON period of the switching device, a current detection signal corresponding to a main current that flows in the switching device; and
a driving circuit configured to adjust, according to the temperature detection signal and the current detection signal, a driving current to be supplied to a control terminal of the switching device, wherein
the driving circuit is configured to decrease the driving current according to the temperature detection signal indicating a lower temperature of the switching device, and
the driving circuit is configured to decrease the driving current according to the current detection signal indicating a smaller current regarding the main current, the driving circuit being further configured to:
set, in response to a temperature indicated by the temperature detection signal falling within a first temperature range out of a plurality of temperature ranges, a magnitude of the driving current to a magnitude associated with the first temperature range irrespective of a value of the current detection signal; and
adjust, in response to the temperature indicated by the temperature detection signal falling within a second temperature range out of the plurality of temperature ranges, the magnitude of the driving current according to the value of the current detection signal.

5. The driving apparatus according to claim 4, wherein the second temperature range is a temperature range having a lowest temperature out of the plurality of temperature ranges, and the first temperature range is a temperature range other than the temperature range having the lowest temperature out of the plurality of temperature ranges.

6. The driving apparatus according to claim 3, wherein the driving circuit is configured to set a magnitude of the driving current to a magnitude associated with a combination of a temperature range including a temperature indicated by the temperature detection signal out of a plurality of temperature ranges and a current range including a current value indicated by the current detection signal out of a plurality of current ranges.

7. The driving apparatus according to claim 1, wherein the driving circuit includes:
a current mirror circuit configured to output the driving current obtained by amplifying a supplied current;
a voltage output circuit configured to output a control voltage corresponding to the temperature detection signal and the current detection signal; and
a current control circuit configured to supply a current corresponding to the control voltage to the current mirror circuit.

8. The driving apparatus according to claim 2, wherein the driving circuit includes:
a current mirror circuit configured to output the driving current obtained by amplifying a supplied current;
a voltage output circuit configured to output a control voltage corresponding to the temperature detection signal and the current detection signal; and
a current control circuit configured to supply a current corresponding to the control voltage to the current mirror circuit.

9. The driving apparatus according to claim 1, wherein the driving circuit includes:
a current mirror circuit configured to output the driving current obtained by amplifying a supplied current; and
a current control circuit configured to supply a current corresponding to the temperature detection signal and the current detection signal to the current mirror circuit.

10. The driving apparatus according to claim 2, wherein the driving circuit includes:
a current mirror circuit configured to output the driving current obtained by amplifying a supplied current; and
a current control circuit configured to supply a current corresponding to the temperature detection signal and the current detection signal to the current mirror circuit.

11. The driving apparatus according to claim 1, wherein the driving circuit includes:
a current mirror circuit configured to output the driving current obtained by amplifying a supplied current; and
a gain factor setting circuit configured to set a gain factor of the current mirror circuit according to the temperature detection signal and the current detection signal.

12. The driving apparatus according to claim 2, wherein the driving circuit includes:
a current mirror circuit configured to output the driving current obtained by amplifying a supplied current; and
a gain factor setting circuit configured to set a gain factor of the current mirror circuit according to the temperature detection signal and the current detection signal.

13. A driving method comprising:
outputting, by a temperature detection circuit, a temperature detection signal corresponding to a temperature of a switching device;
outputting, by a current detection circuit, a current detection signal corresponding to a main current that flows in the switching device;
setting a magnitude of a driving current to be supplied to a control terminal of the switching device to a magnitude associated with a first temperature range irrespective of a value of the current detection signal; and
adjusting a magnitude of the driving according to the value of the current detection signal.

* * * * *